United States Patent
Whitehill

(10) Patent No.: US 6,842,883 B2
(45) Date of Patent: Jan. 11, 2005

(54) APPLICATION OF CO-VERIFICATION TOOLS TO THE TESTING OF IC DESIGNS

(75) Inventor: Clifford A. Whitehill, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 241 days.

(21) Appl. No.: 10/178,193

(22) Filed: Jun. 24, 2002

(65) Prior Publication Data

US 2003/0237062 A1 Dec. 25, 2003

(51) Int. Cl.[7] .............................................. G06F 17/50
(52) U.S. Cl. ...................... 716/4; 716/5; 716/2; 716/18
(58) Field of Search ............................ 716/1–6, 16–18; 703/13, 14, 17

(56) References Cited

U.S. PATENT DOCUMENTS

| | | | |
|---|---|---|---|
| 6,272,451 B1 * | 8/2001 | Mason et al. ................. | 703/13 |
| 6,389,379 B1 * | 5/2002 | Lin et al. ...................... | 703/14 |
| 6,571,373 B1 * | 5/2003 | Devins et al. ................. | 716/5 |
| 6,701,490 B1 * | 3/2004 | Talukdar et al. ............... | 716/4 |
| 2002/0120909 A1 * | 8/2002 | Brouhard et al. .............. | 716/5 |

* cited by examiner

*Primary Examiner*—Matthew Smith
*Assistant Examiner*—Binh Tat
(74) *Attorney, Agent, or Firm*—Westman, Champlin & Kelly

(57) ABSTRACT

An IC design is tested on a workstation through a hardware simulator. The workstation includes a co-verification software tool that executes IC firmware to operate the IC design and test the IC design and IC firmware. The co-verification software tool further operates to supply test stimuli to the IC design and to receive responses for analysis. The test stimuli are written in a programming language, which permits ease of testing and analysis of the IC design.

17 Claims, 1 Drawing Sheet

APPLICATION OF CO-VERIFICATION TOOLS TO THE TESTING OF IC DESIGNS

FIELD OF THE INVENTION

This invention relates to testing integrated circuit (IC) designs that are controlled by firmware and/or software, and particularly to employing co-verification tools to provide test stimuli to the IC devices, or chips, being developed.

BACKGROUND OF THE INVENTION

Integrated circuits (ICs) are usually designed by creating an IC specification that describes the functions of the IC device. The design is thereafter reduced to a hardware description language (HDL), such as Verilog or VHDL, at a level of abstraction known as the registered transfer level (RTL). The HDL code functionally describes operations that the IC device will perform on data as they flow between circuit inputs, outputs and clocked registers. The HDL code is both machine and human readable and is commonly used for development, verification, synthesis and testing of integrated circuit designs.

During development, testing is performed on the HDL description of the IC device using a hardware simulator executing the HDL description of the IC design. Signals are supplied to the IC design to perform design functions under various conditions. To facilitate testing of IC designs that are controlled by IC firmware, there is a class of software tools, herein referred to as "co-verification tools", that executes the IC firmware on a standard workstation. The IC firmware, which, during development, is usually written in a high level language such as C/C++, is compiled and executed on the workstation using the co-verification tool. As used herein, "firmware" comprises the code that operates the IC device so that the IC device can perform its functions. For example, IC firmware includes firmware residing on the IC device as well as software and firmware used by a CPU coupled to the IC device to execute IC functions.

The co-verification tool operates on the designer's workstation to operate the hardware simulation of the IC design to perform many of the same functions as the IC device (when fabricated) will perform when is coupled to its intended CPU. Using the co-verification tool, the workstation provides signals in a standard format (i.e., compatible to the industry or proprietary standard of the CPU interface) and supplies them to the IC design via a functional model of the processor or CPU bus in the hardware simulator, to thereby operate the IC design. Hence, the co-verification tool is used to verify both the IC design functions as well as the IC firmware.

One feature of the co-verification software tool is that the IC firmware is executed on the workstation. Consequently, it is not necessary to operate the IC firmware on a hardware simulation of the CPU, and therefore it is not necessary to simulate the CPU hardware. Elimination of the simulation of the CPU hardware simplifies the design process and verification for the IC device. Moreover, because the co-verification tool permits execution of the IC firmware on the workstation, it is not necessary to simulate the IC firmware for execution on the workstation.

One such co-verification tool, known as a "Virtual CPU" or "V-CPU", is commercially available from Summit Design of West Marlboro, Mass.

It is often necessary to test the IC design during the design process with stimuli supplied through the IC's system interface that will be used for coupling the IC to peripheral and control devices. Examples of system interfaces include small computer systems interface (SCSI) and fibre channels. (Although these couplings are called "buses", they may be serial or parallel buses and consist of single or plural data paths.) In the past, the test stimuli were generated by the hardware simulator in the form of test signals to the IC design through the system interface of the IC design. Responses to test stimuli were analyzed using the hardware simulator.

Prior to the present invention, the IC design was operated through the co-verification tool using the IC firmware and tested by the hardware simulator with test stimuli supplied through the system interface. Consequently, it was necessary to simulate the peripheral device and system interfaces, including firmware associated with the peripheral device, on the hardware simulator. Moreover, it was necessary to operate the hardware simulator to supply test stimuli to the IC design, and it was necessary that responses to the stimuli were analyzed on the hardware simulator. As a result, the flexibility permitted by workstations, including the use of software debug tools resident on workstations, was not available for testing the IC design. As a result, the test procedure through the system bus was both time consuming and limited. There is a need, therefore, for a technique that permits use of the workstation and its compatible programming languages for generating test stimuli to IC designs under test.

SUMMARY OF THE INVENTION

In accordance with one embodiment of the invention, an IC design that is described in HDL code is tested by operating co-verification software in a workstation to execute the IC firmware and to issue test stimuli to the IC design via a modeled system interface to drive the IC design with test signals. The test stimuli are generated by software in the program language compatible with the workstation. Responses to the test signals are analyzed on the workstation.

DETAILED DESCRIPTION OF THE PREFERRED EMBODIMENTS

In accordance with the present invention, a workstation, such as a Unix- or Linux-based computer, contains a co-verification software tool that tests both an IC design and IC firmware. The workstation also contains the IC firmware of the IC device under design or test. The workstation is coupled to, or includes, a hardware simulator that executes the HDL code of the IC device and simulates the IC device. The co-verification software executes the IC firmware in the workstation to operate the IC design and execute its functions. The co-verification software in the workstation also executes test software to supply test stimuli to the hardware simulation of the IC device via a modeled system interface of the IC design. The workstation analyzes responses to the stimuli to evaluate the IC design and IC firmware.

In most cases, the IC device is not yet fabricated so the IC design is an HDL code representing the functions of the IC device to be made. Nevertheless, the invention is also useful to test actual hardware IC devices to verify compliance with IC specifications. Consequently, while the invention will be described in conjunction with testing an IC design of an IC device yet to be fabricated, those skilled in the art will appreciate that an actual IC device might be tested instead.

Figure 1:
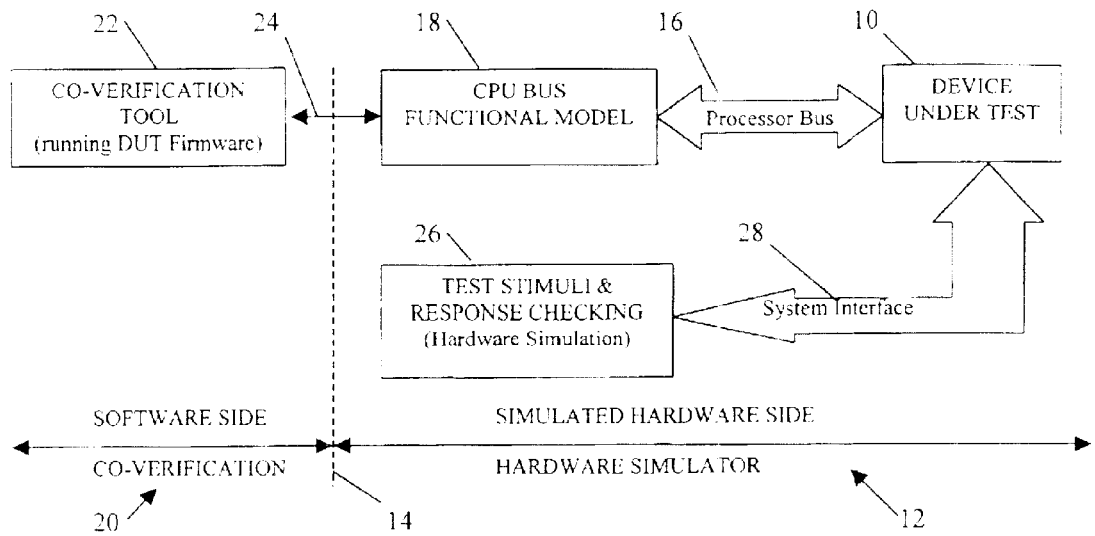
FIG. 1 is a functional block diagram of a test arrangement for testing an IC design according to prior techniques.

FIG. 1 is a functional block diagram of apparatus for testing integrated circuit (IC) designs according to one known technique. IC design 10 is in the form of HDL code that functionally describes the operation of an IC device, which, when fabricated according to the IC design, will perform operations on data as the data flow between circuit inputs and outputs and clock registers of the IC device.

The HDL code of the IC design 10 under test is executed by hardware simulator 12, functionally illustrated to the right side of dashed line 14. Hardware simulator 12 simulates the external processor buses 16 of the IC design 10 and includes functional model 18 of the CPU bus.

Workstation 20 contains co-verification software tool 22, shown functionally to the left side of line 14, that operates workstation 20 to execute the IC firmware with which an IC device, built in accordance with the design 10, will operate. Co-verification tool 22 is coupled via a communication link or socket 24 to hardware simulator software 12, which may also reside on workstation 20, or on a different processor (not shown) coupled to workstation 20. Signals are supplied to the functional model of the CPU bus 18 in hardware simulator 12 based on the IC firmware. The signals supplied to CPU bus 18 are compatible with the applicable CPU interface of the IC device under test, such as an industry standard interface or proprietary interface.

The IC firmware is executed on workstation 20 under control of co-verification tool 22 to perform functions on IC design 10 in the same manner that the IC firmware will perform functions on the IC device, when fabricated, and when executed by the hardware CPU and IC firmware. The co-verification software thus tests, or verifies, both the IC design and IC firmware. If the IC firmware is written in workstation compatible language, the IC firmware may be directly compiled on the workstation and executed by the co-verification tool without simulating the CPU or its firmware.

The system bus and drivers are simulated on hardware simulator 12 to provide test stimuli 26 to IC design 10 through a hardware simulation of system interface 28 of the IC design 10. Stimuli 26 mimic operation of the system bus and drivers, when operating under control of peripheral device firmware. Thus, hardware simulator 12 supplies test stimuli 26 based on the functions of the system interface and drivers described in HDL code as driven by the peripheral device firmware, rather than the actual firmware itself. Test stimuli 26 provides signals to IC design 10 to operate the IC design in the same manner that peripheral device firmware would operate the IC device when fabricated. The simulated system interface 28 may be a simulation of a peripheral bus of the IC device, such as a SCSI bus or a fibre channel.

Although FIG. 1 illustrates use of a co-verification software tool by workstation 20, in some environments the CPU hardware might be simulated by hardware simulator 12. In those cases, the entire test operation is performed using a hardware simulator.

One difficulty with the test apparatus illustrated in FIG. 1 is that the test stimuli 24 and analysis of the responses to the test stimuli are not written in a workstation compatible program language. Instead, the peripheral devices, or at least that much of the peripheral devices that interface with the system interface 28, are simulated by the hardware simulator, and the test stimuli are generated by the hardware simulator. Responses are analyzed using the simulator. It is time consuming to define the relevant functions of the peripheral devices (including peripheral bus and drivers under control of the peripheral device firmware) in HDL code. Moreover, tests generated by hardware simulators are not as flexible as those generated by high level program languages and do not enjoy the availability of a wide range of software testing tools, such as software debug tools. Consequently, the use of hardware simulators to generate and analyze tests on IC designs limited the flexibility of test procedures and adversely affected the time required to perform such tests. Thus the test apparatus illustrated in FIG. 1 is a limiting factor on the efficiency of testing IC designs, and the flexibility of the designers in creating test procedures.

Figure 2:
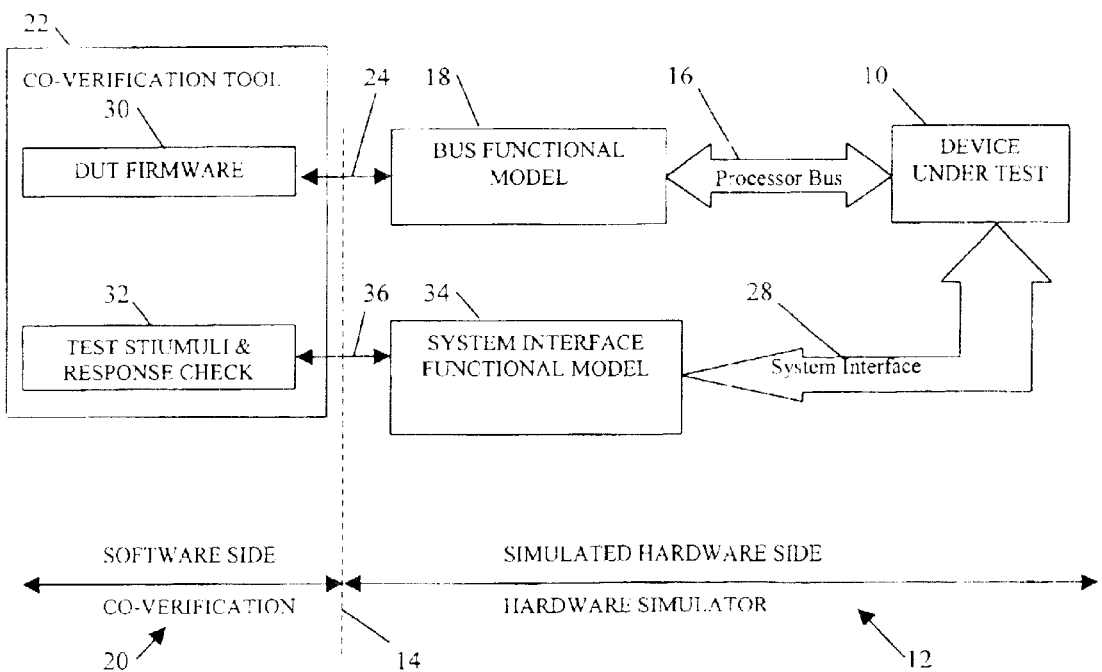
FIG. 2 is a functional block diagram of an embodiment of a test arrangement for testing an IC design according to the present invention.

The present invention, illustrated functionally in FIG. 2, provides test software 32 on workstation 20 that issues test stimuli and analyzes responses and that operates through a model of the system interface or signal paths 34 and peripheral devices (as appropriate) and the simulated system interface 28 of the IC design to provide test stimuli to IC design 10. Co-verification software tool 22 operates on both the IC firmware 30 and test stimuli 32 to operate and test IC design 10 and firmware 30 as in FIG. 1, and to supply test signals to IC design 10 through the system interface model. Responses to the test stimuli are received by the response checking portion 32 so that the workstation can analyze responses of the design 10.

The test stimuli and response checking 32 is performed in the programming language of the workstation, such as C or C++. Workstation 20 is coupled by socket 36 to hardware simulator 12 to supply the test stimuli to bus or signal path model 34 and receive responses from model 34. Consequently, IC design 10 under test is operated by the co-verification tool 22 by execution of the IC firmware on workstation 20 and test operations associated with it are performed by the workstation using test stimulation and response checking programs 32 on workstation 20. This feature increases the flexibility of the test procedures by permitting test software to be written in a high level programming language and executed on a workstation which reduces execution time. Additionally, software tools, such as debug programs may be employed with the test procedures.

In preferred embodiments, the invention is carried out in a workstation or computer having a memory medium, such as a recording disk of a disk drive. The co-verification software and test software are in the form of a computer readable program recorded on the disk and containing computer readable program code that executes the IC firmware, operates the IC design using the IC firmware and supplies the test stimuli to the IC design. The computer readable program also contains program code that analyzes the IC design using the responses, tests the IC firmware and tests operation of the IC design.

Although the present invention has been described with reference to preferred embodiments, workers skilled in the art will recognize that changes may be made in form and detail without departing from the spirit and scope of the invention.

What is claimed is:

1. A process of testing an IC design described in HDL code in conjunction with a hardware simulator and a co-verification tool on a workstation, wherein the co-verification tool provides both firmware control of the IC design via a modeled processor bus, and test stimuli of the IC design via a modeled system interface that is either an industry standard or a proprietary interface, the process comprising steps of:

a) operating the co-verification tool in the workstation to execute IC firmware associated with the IC design;

b) operating the IC design through the modeled processor bus using the executed IC firmware; and c) operating the co-verification tool in the workstation to supply test stimuli through the modeled system interface to the IC design, the test stimuli being compatible to the industry standard or proprietary interface and the IC design being responsive to the test stimuli to provide responses to the workstation so that the workstation is used to analyze the responses of the IC design.

2. The process of claim 1, further including:

d) operating the co-verification tool in the workstation to analyze the IC design using the responses.

3. The process of claim 2, wherein step c) is performed by executing the co-verification software and test software on the workstation, the process further including steps of:

e) testing the IC firmware, and f) testing operation of the IC design.

4. The process of claim 3, wherein the test software is written in a programming language compatible with the workstation, rather than in HDL.

5. The process of claim 3, wherein the test stimuli are associated with a peripheral device with which the fabricated IC chip is intended to operate.

6. The process of claim 2, wherein the test stimuli are associated with a peripheral device with which the fabricated IC chip is intended to operate.

7. The process of claim 1, further including steps of:

g) testing the IC firmware, and h) testing operation of the IC design.

8. The process of claim 7, wherein the test stimuli are associated with a peripheral device with which the fabricated IC chip is intended to operate.

9. The process of claim 1, wherein the modeled system interface simulates a channel associated with the peripheral device between the workstation and the IC design to perform tests on the IC design based on test stimuli.

10. The process of claim 9, wherein the channel is selected from the group consisting of fibre channels and SCSI buses.

11. The process of claim 1, wherein the test stimuli are associated with a peripheral device with which the fabricated IC chip is intended to operate.

12. A computer useable medium having a computer readable program embodied therein for testing an IC design described in HDL code in a hardware simulator, the computer readable program comprising:

a first computer readable program comprising:
computer readable program code for causing the hardware simulator to model a processor bus that processes IC firmware, and
computer readable program code for causing the hardware simulator to model a system interface that is either an industry standard or a proprietary system interface;

a second computer readable program comprising:
computer readable program code for causing the computer to execute IC firmware associated with the IC design, and
computer readable program code for causing the computer to operate the IC design through the modeled processor bus in the hardware simulator using the executed IC firmware; and a third computer readable program comprising computer readable program code for causing the computer to supply test stimuli compatible to the industry standard or proprietary interface through the modeled system interface to the IC design and to receive responses to the test stimuli.

13. The computer useable medium of claim 12, wherein the third computer readable program further comprises:
computer readable program code for causing the computer to analyze the IC design using the responses.

14. The computer useable medium of claim 13, wherein the second computer readable program comprises:
co-verification and test software for causing the computer to test the IC firmware and test operation of the IC design.

15. The computer useable medium of claim 14, wherein the test software is written in a programming language compatible with the workstation, rather than HDL.

16. The computer useable medium of claim 12, wherein the second computer readable program comprises:
co-verification and test software for causing the computer to test the IC firmware and test operation of the IC design.

17. The computer useable medium of claim 16, wherein the test software is written in a programming language compatible with the workstation, rather than HDL.

* * * * *